United States Patent
Hendrickson (10) Patent No.: US 7,965,207 B2
(45) Date of Patent: Jun. 21, 2011

(54) VARIABLE LENGTH INTEGER ENCODING SYSTEM AND METHOD

(75) Inventor: Benjamin Cappel Hendrickson, Bellevue, WA (US)

(73) Assignee: SEOmoz, Inc., Seattle, WA (US)

(*) Notice: Subject to any disclaimer, the term of this patent is extended or adjusted under 35 U.S.C. 154(b) by 0 days.

(21) Appl. No.: 12/572,990

(22) Filed: Oct. 2, 2009

(65) Prior Publication Data

US 2010/0085223 A1 Apr. 8, 2010

Related U.S. Application Data

(60) Provisional application No. 61/102,785, filed on Oct. 3, 2008, provisional application No. 61/102,775, filed on Oct. 3, 2008.

(51) Int. Cl.
*H03M 7/40* (2006.01)

(52) U.S. Cl. ................ 341/67; 341/50; 341/51

(58) Field of Classification Search ............ 341/50, 341/51, 67, 76
See application file for complete search history.

(56) References Cited

U.S. PATENT DOCUMENTS

| | | | | |
|---|---|---|---|---|
| 5,724,033 A * | 3/1998 | Burrows | ............... | 341/76 |
| 5,973,626 A * | 10/1999 | Berger et al. | ............... | 341/65 |
| 6,005,503 A | 12/1999 | Burrows | | |
| 6,172,626 B1 * | 1/2001 | McDonnell et al. | ............... | 341/67 |
| 6,970,114 B2 * | 11/2005 | Lovell | ............... | 341/100 |
| 7,246,124 B2 * | 7/2007 | Koskas | ............... | 707/737 |
| 7,286,066 B1 * | 10/2007 | Ho et al. | ............... | 341/67 |
| 7,609,000 B1 * | 10/2009 | Sharma | ............... | 314/67 |
| 2003/0206124 A1 * | 11/2003 | Lovell | ............... | 341/50 |

OTHER PUBLICATIONS

Dlugosz, John, Dlugosz' Variable-Length Integer Encoding—Revision 2, 2003, http://www.dlugosz.com/ZIP2/VLI.html.

* cited by examiner

*Primary Examiner* — Jean B Jeanglaude
(74) *Attorney, Agent, or Firm* — Æ Law; Adam L.K. Philipp (57) ABSTRACT

Large integers may be stored according to byte-stable variable-length encoding systems and methods, eliminating the need to store many leading-zero bits in large integers. Such a byte-stable variable-length integer encoding scheme may represent identical sequences of numbers in a consistent byte pattern within a byte stream, preserving the redundancy of the data and allowing for improved compression rates.

19 Claims, 7 Drawing Sheets

VARIABLE LENGTH INTEGER ENCODING SYSTEM AND METHOD

CROSS REFERENCE TO RELATED APPLICATIONS

This application claims the benefit of priority to U.S. provisional patent application 61/102,785, filed Oct. 3, 2008, entitled WEB-SCALE DATA PROCESSING SYSTEM AND METHOD, to Benjamin C. Hendrickson and Nicholas S. Gerner. This application is related to co-filed U.S. patent application Ser. No. 12/572,989, filed Oct. 2, 2009, entitled WEB-SCALE DATA PROCESSING SYSTEM AND METHOD, to Benjamin C. Hendrickson and Nicholas S. Gerner. This application is also related to provisional patent application 61/102,775, filed Oct. 3, 2008, entitled INDEX RANK OPTIMIZATION SYSTEM AND METHOD, to Benjamin C. Hendrickson, Nicholas S. Gerner, and S. Rand Fishkin. The above-cited applications are incorporated herein by reference in their entireties, for all purposes.

FIELD

The present disclosure relates to computing, and more particularly to systems and methods for encoding, storing, and processing variable length integers.

BACKGROUND

Generally speaking, variable length integer encoding uses an arbitrary number of eight-bit bytes to represent an integer. The Musical Instrument Digital Interface (MIDI) file format makes use of variable length integer encoding, as does the Wireless Application Protocol (WAP). 8-bit UCS/Unicode Transformation Format (UTF-8) also uses a variable length encoding scheme.

Many computing operations may involve data expressed as 64-bit unsigned or unsigned integers. Such data may include values within a large range, including both small and large values, and often duplicate values. However, this kind of data may be, in some ways, ill-suited to general-purpose compression schemes (e.g., Lempel-Zev implementations such as lzo, and gz, or other types of lossless encoding, such as Huffman, Arithmetic, Golomb, run-length encoding, and the like). In uncompressed form on disk, such values generally require a full 64-bits of storage space, even though many of the leading bits may be zero bits.

In a common implementation of variable length integer encoding, a continuation bit within a byte is reserved to indicate whether the following byte is also part of the current integer representation. If the continuation bit of a byte is 0, then that is the last byte of the integer. If the continuation bit of a byte is 1, then the following byte is also part of the integer. The scalar value of the variable length integer is the concatenation of the non-control bits (i.e. data bits). However, continuation-bit schemes may not compress optimally because every eighth bit is a control bit, not a data bit. Additionally, decoding continuation-bit-encoded integers may be relatively slow and complex, in part because a branch or other flow control mechanism may be required when processing each byte to determine whether the current integer's data bits continue into the next byte.

In alternate approaches, a block of continuation bits may be stored apart from the binary bytes that represent the integer. For example, an alternate encoding scheme may insert a byte of continuation bits for every eight data bytes. However, in such an alternate scheme, compressibility may also suffer in part because, as a result of the periodically-inserted control bytes, repeated sequences of numbers may not be represented by identical byte sequences within a byte-stream.

A related approach also uses periodically-inserted control bytes, but the control bytes represent a sequence of integer byte-lengths rather than control bits. Such an approach shares similar shortcomings as those discussed just above.

In the approach used by UTF-8 encoding, each byte has 0-4 leading 1-bits followed by a 0-bit. Zero 1-bits indicate a 1-byte sequence; one 1-bit indicates a continuation byte in a multi-byte sequence; and two or more 1-bits indicate the first byte in an N-byte sequence. The scalar value of the variable length integer is the concatenation of the (non-contiguous) non-control bits. However, the UTF-8 approach is inefficient and may not compress optimally in part because it uses at least two bits in every byte as control bits.

Other variable length integer encoding schemes use a variable number of leading 1-bits, generally followed by a 0-bit, as control bits that map to different byte lengths.

The schemes discussed above tend to decrease the compressibility of the data because patterns within the data may be broken up by control data, such that the same sequence of numbers may not always be represented by the same sequence of bytes within a byte-stream. In addition, approaches such as those described above can be relatively computationally expensive to decode, requiring branching or some other method of flow control within a decoding routine.

DESCRIPTION

The detailed description that follows is represented largely in terms of processes and symbolic representations of operations by conventional computer components, including a processor, memory storage devices for the processor, connected display devices, and input devices. Furthermore, these processes and operations may utilize conventional computer components in a heterogeneous distributed computing environment, including remote file Servers, computer Servers and memory storage devices.

In one embodiment, a byte-stable variable-length integer encoding scheme may eliminate the need to store many of these leading zero bits. Furthermore, such a variable-length integer encoding scheme may be well suited to power-law distributions (where small values, with many leading zeros, occur very frequently, and large values with few leading zeros occur very rarely), such as are often observed in certain types of data values. Moreover, a byte-stable variable-length integer encoding scheme may represent identical sequences of numbers in a consistent byte pattern within a byte stream (e.g., the sequence, 57, 357, 58927, 24 is always represented by the same sequence of bytes). Accordingly, a byte-stable variable-length integer encoding scheme may preserve the redundancy of the data. Preserving such redundancy may allow for compression rates comparable to those achieved by Lempel-Ziv.

Figure 1:
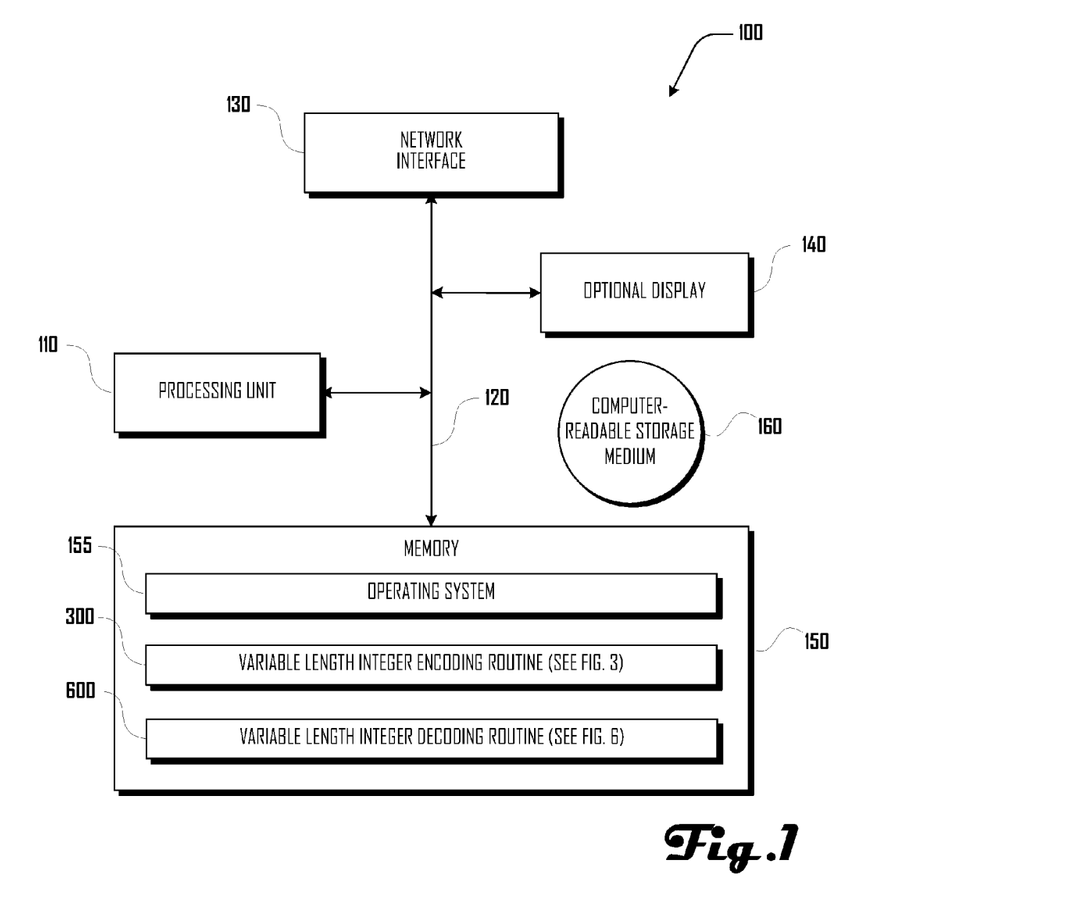
FIG. 1 is a diagram of components of a computing system in accordance with one embodiment.

FIG. 1 illustrates an exemplary computing device 100 suitable for encoding and/or decoding variable length integers. In some embodiments, the computing device 100 may include many more components than those shown in FIG. 1. However, it is not necessary that all of these generally conventional components be shown in order to disclose an illustrative embodiment. As shown in FIG. 1, the computing device 100 includes a network interface 130 for connecting to a network. Network interface 130 includes the necessary circuitry for such a connection and is constructed for use with the appropriate protocol.

The computing device 100 also includes a processing unit 110, a memory 150 and may include an optional display 140, all interconnected along with the network interface 130 via a bus 120. The memory 150 generally comprises a random access memory ("RAM"), a read only memory ("ROM"), and a permanent mass storage device, such as a conventional disk drive, an array of hard drives, or other accessible storage device or service. In some embodiments, memory 150 may comprise an online storage service, such as Amazon Simple Storage Service (S3), operated by Amazon.com, Inc. of Seattle Wash., or Windows Azure, provided by Microsoft Corporation of Redmond, Wash. The memory 150 stores program code for a variable length integer encoding routine 300 and a variable length integer decoding routine 600, as described herein.

In addition, the memory 150 also stores an operating system 155. It will be appreciated that these software components may be loaded from a computer readable medium into memory 150 of the cluster machine 100 using a drive mechanism (not shown) associated with a computer readable storage medium 160 (such as a floppy disc, tape, DVD/CD-ROM drive, memory card), via the network interface 130, or the like. Some or all of the components described herein may be "virtual" components.

Figure 2:
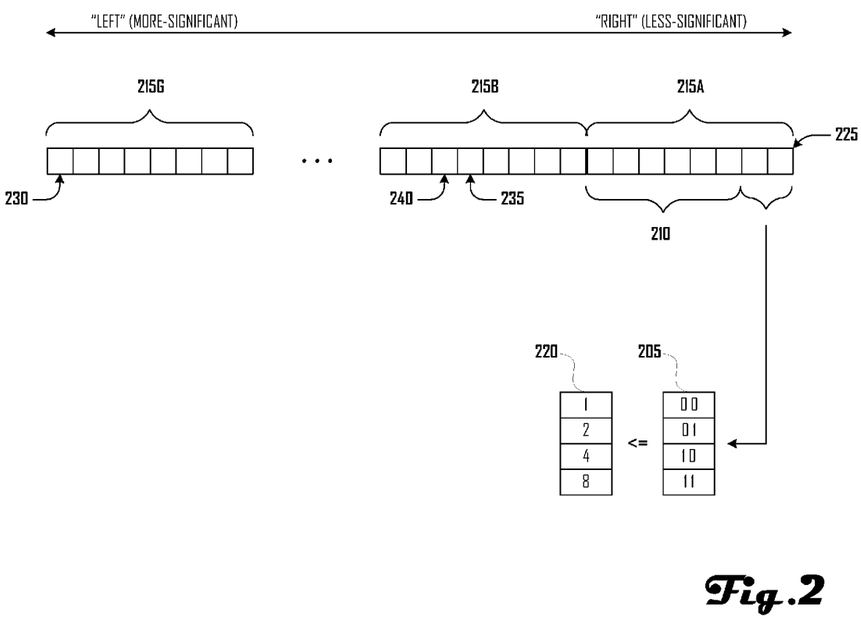
FIG. 2 is a diagram illustrating a byte-stable variable length integer encoding scheme in accordance with one embodiment.

In one embodiment, a byte-stable variable-length integer encoding scheme may be implemented as illustrated in FIG. 2. In the illustrated embodiment, a number ("M") of the "rightmost" or least-significant bits 205 in the first byte 215A of an encoded integer are control bits specifying the number of bytes used to represent the integer. In one embodiment, various patterns of control bits 205 correspond to entries in an ordered group 220 of byte-lengths. In the illustrated embodiment, four different patterns of control bits 205 correspond respectively to byte-lengths of 1, 2, 4, and 8. In the illustrated embodiment, two control bits are used, and the maximum byte length is 8, so up to 62 data bits can be used to represent an integer value. In other embodiments, up to seven control bits could be used to describe the number of bytes used to represent the integer. The remaining bits 210 left-adjacent to control bits 205 in the first byte 215A, as well as all of the bits the following bytes 215B-G (if any), contain data bits representing the integer.

As illustrated in FIG. 2, the terms "right" and "left" are used herein to refer to the less-significant and more-significant ends of an integer representation, respectively. In other words, within a sequence of bytes 215A-G, the least-significant bit 225 is the "rightmost" bit, while the most-significant bit 230 is the "leftmost" bit. Similarly, a given bit 235 occupies a less-significant bit position than an adjacent bit 240 to the given bit's right. To "shift" an operand (e.g., a fixed-integer and/or an encoded variable-length integer) means to move every bit in the operand a given number of bit positions towards the most-significant bit (left shift) or towards the least-significant bit (right shift). In many embodiments, bits shifted off of one end or the other of the operand are simply dropped, and vacant bit-positions are filled in, generally with zeros.

As used herein, the terms "right" and "left" do not refer to actual memory addressing schemes that may be used to read and/or write a particular byte or group of bytes. The systems and methods described herein operate regardless of whether an underlying computing infrastructure stores multi-byte integers in big- or little-endian order.

Exemplary embodiments are designed to encode 64-bit integers (with at least two leading or leftmost zeros). In other embodiments, smaller or larger integers could be encoded/decoded by varying the byte-length values in the ordered group 220 of byte-lengths. In some embodiments, additional discrete byte lengths could be encoded by using more control bits 1405. For example, in an embodiment designed to encode/decode 128-bit integers (with at least two leading zeros), two control bits 1405 may be employed, and ordered group 220 of byte-lengths may comprise 1, 4, 8, 16. Alternately, three control bits may be employed to encode/decode 128-bit integers (with at least three leading zeros), and ordered group 220 of byte-lengths may comprise 1, 2, 3, 4, 6, 8, 12, 16. In yet another embodiment, 32-bit integers (with at least two leading zeros) may be encoded using two control bits and ordered group 220 of 1, 2, 3, 4. In still further embodiments, other combinations are possible.

In the exemplary embodiment, byte-stable variable-length encoded integers may be read and written in a manner similar to that described in the following code excerpts. In the first code excerpt (the "Write" function), the parameter "unencoded_in" holds a fixed-length integer having at least M leading zero-bits to encode as a variable-length integer. The parameter "*encoded_out" holds a pointer into the output byte-stream into which the new encoded variable-length integer will be placed. The Write function returns the number of bytes that it added to the output byte-stream.

```
unsigned long long Write(unsigned long long unencoded_in, char *encoded_out)
{
    static const int m = 2;
    static const unsigned long long length_codes[8] = {3, 3, 3, 3, 2, 2, 1, 0};
    static const unsigned long long lengths[8] = {8, 8, 8, 8, 4, 4, 2, 1};
    int leading_zeros = __builtin_clzll(unencoded_in | 0x1);
        // gcc intrinsic that compiles down to the count leading zeros instruction on x64
    assert(leading_zeros >= m);
    int empty_bytes = (leading_zeros-m)/8;
    *(unsigned long long*)(encoded_out) = (unencoded_in << m) +
        length_codes[empty_bytes];
    return lengths[empty_bytes];
}
```

In the second code excerpt (the "decode_variable" function), the parameter "encoded_in" holds the next N (here, 8) bytes from an encoded byte-stream. The parameter "*decoded_out" is a pointer to the fixed-length integer that will hold the next integer in the encoded byte-stream (the output integer). The decode_variable function returns the number of bytes in the encoded byte-stream that were occupied by the encoded output integer.

```
unsigned long long decode_variable(unsigned long long encoded_in,
        unsigned long long *decoded_out)
{
    static const int m = 2;
    static const unsigned long long masks_by_code[ ] = { 0x00000000000003full,
        0x0000000000003ffffull, 0x000000003ffffffull, 0x3ffffffffffffffull };
    static const unsigned long long lengths_by_code[ ] = {1, 2, 4, 8};
    unsigned long long length_code = encoded_in & 0x3;
    *decoded_out = (encoded_in >> m) & masks_by_code[length_code];
    return lengths_by_code[length_code];
}
```

Figure 3:
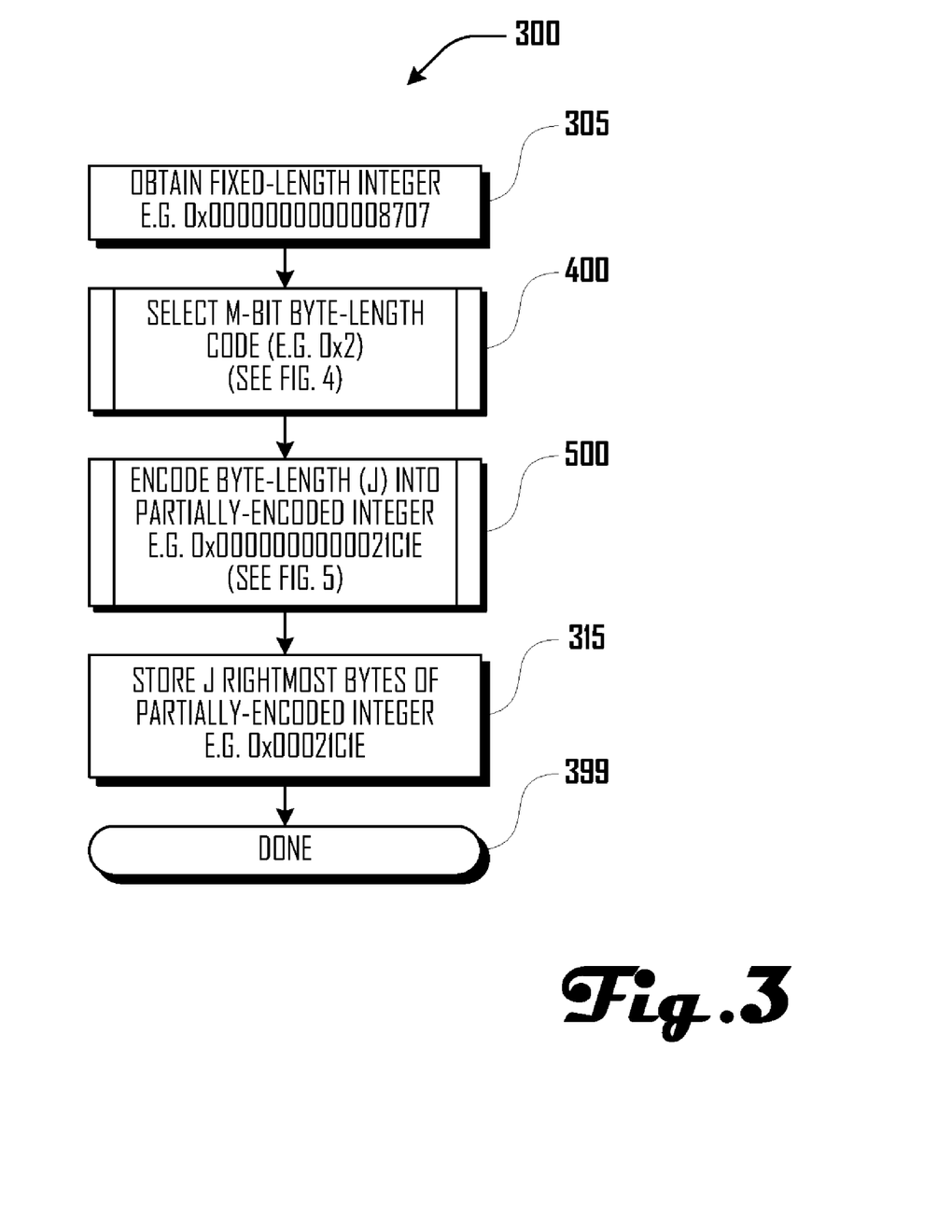
FIG. 3 is a flow diagram of an exemplary variable length integer encoding routine in accordance with one embodiment.

FIG. 3 illustrates an exemplary variable length integer encoding routine 300 in accordance with one embodiment. In block 305, routine 300 obtains a fixed-length integer operand. In the illustrated example, routine 300 may obtain a 64-bit integer (such as 0x0000000000008707), but in other embodiments, routine 300 may obtain a 32-bit integer (such as 0x00008707), or other fixed-size integer.

In block 400, routine 300 calls subroutine 400 (see FIG. 4, discussed below) to select an M-bit byte-length code. As used herein, "M" refers to a predetermined, constant number of control bits used to encode the byte-length of the encoded integer.

Figure 4:
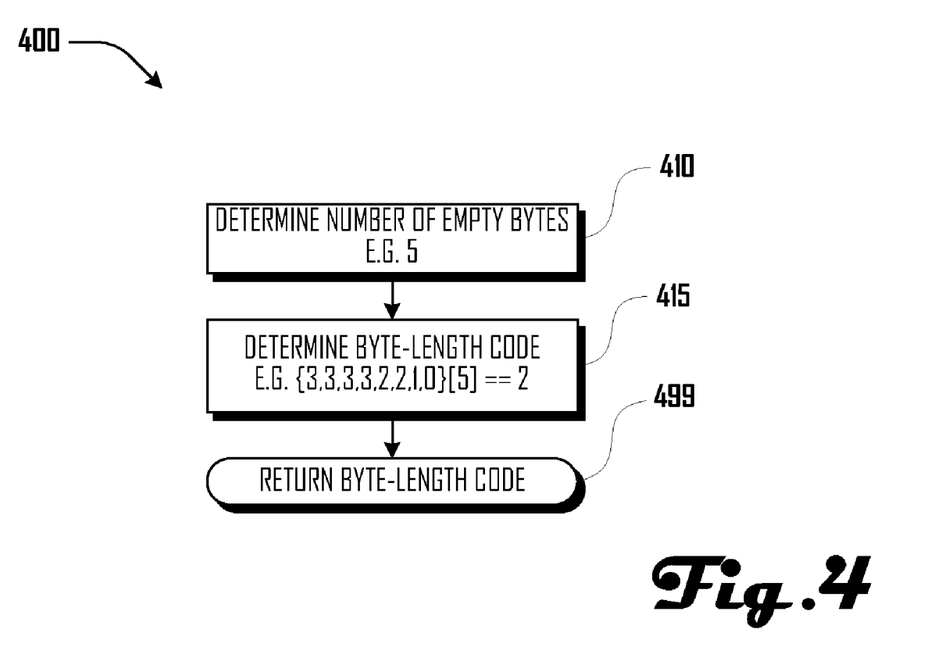
FIG. 4 is a flow diagram of an exemplary byte-length code selection subroutine in accordance with one embodiment.

FIG. 4 illustrates an exemplary byte-length code selection subroutine 400 in accordance with one embodiment. In block 410, subroutine 400 determines a number of empty leading bytes in the fixed-length integer operand. In one embodiment, determining a number of empty leading bytes may comprise counting a number of leading zero bits, such as via an assembler instruction "BSR," "CLZ," "LMBD," or the like, and translating the number of leading zero bits into a whole number of empty bytes after adjusting for the number of control bits (M) (e.g., (leading_zeros−M)/8). In the illustrated example, subroutine 400 may determine that the fixed-length integer operand has 48 leading zeros and five empty leading bytes. In other embodiments, subroutine 400 may determine a number of empty leading bytes indirectly, such as by obtaining and processing a number of significant bits (i.e., the leftmost non-zero bit and all bits to its right) in the fixed-length integer operand, or by other means.

In block 415, subroutine 400 determines a byte-length code in accordance with the determined number of empty leading bytes. In one embodiment, determining a byte-length code may comprise selecting a code from an ordered group of byte-length codes (e.g., {3, 3, 3, 3, 2, 2, 1, 0}) according to the determined number of empty leading bytes. In other embodiments, a reverse-ordered group of byte length codes may be indexed according to a determined number of non-empty bytes. In still further embodiments, subroutine 400 may determine a byte-length code algorithmically. In the illustrated example, subroutine 400 may select byte-length code "2" (or 0x2, bit pattern "10"), which corresponds to the byte-length of the encoded integer ("J"). In the illustrated example, the selected byte-length code corresponds to a byte-length J of four for the encoded integer. In block 499, subroutine 400 returns the determined byte-length code.

Referring again to FIG. 3, in block 500, routine 300 calls subroutine 500 (see FIG. 5, discussed below) to encode the determined byte-length value J into a partially-encoded integer corresponding to the fixed-length operand by embedding the selected M-bit byte-length code (i.e., "0x2," or bit pattern "10") into the encoded variable-length integer.

Figure 5:
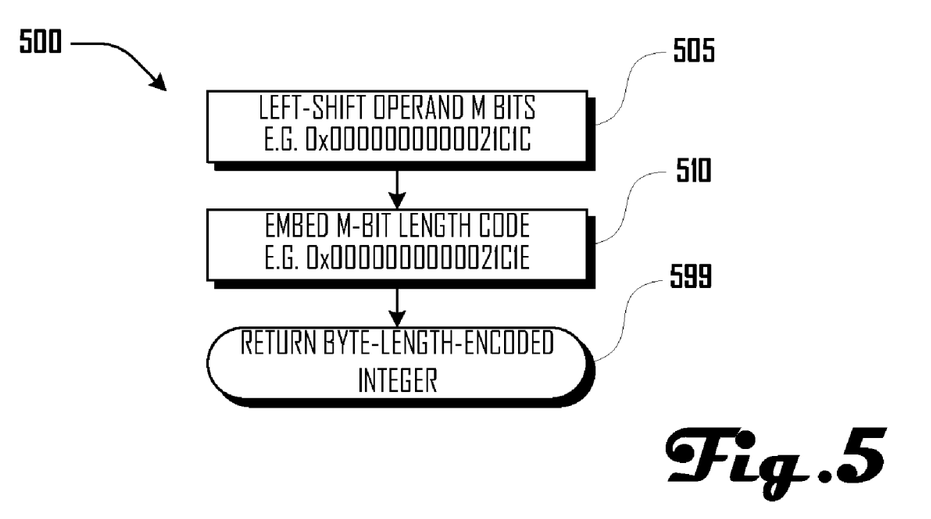
FIG. 5 is a flow diagram of an exemplary byte-length encoding subroutine in accordance with one embodiment.

FIG. 5 illustrates an exemplary byte-length encoding subroutine 500 in accordance with one embodiment. In block 505, subroutine 500 shifts the fixed-length integer operand M bits to the left, leaving zeros in the M rightmost (least-significant) bits of the shifted integer. Because the fixed-length integer operand has at least M leading zero-bits, this operation may be accomplished by rotating or circular-shifting the operand to the left, as well as by logically or arithmetically left-shifting the fixed-length integer operand. In other embodiments, this operation may also be accomplished by multiplying the fixed-length integer operand by $2^M$ or by other suitable operations. In the illustrated example, left-shifting the fixed-length integer operand by 2 (M) bits results in the fixed-integer value 0x0000000000021C1C.

In block 510, subroutine 500 embeds the determined M-bit byte-length code into the left-shifted fixed-length integer to form a partially-encoded fixed-integer value. In one embodiment, this operation may be accomplished by simply adding the determined M-bit byte-length code to the left-shifted fixed-length integer. In other embodiments, this operation may be accomplished by performing a bitwise OR (or other bitwise logical disjunction) with the left-shifted fixed-length integer and the determined M-bit byte-length code. In yet other embodiments, subroutine 500 may embed the determined M-bit byte-length code into the left-shifted fixed-length integer by any other suitable operation. In the illustrated example, embedding the determined M-bit byte-length code into the left-shifted fixed-length integer results in the partially-encoded fixed-integer value 0x0000000000021C1E. In block 599, subroutine 500 returns the partially-encoded fixed-integer value.

Referring again to FIG. 3, in block 315, routine 300 stores the J rightmost bytes of the partially-encoded integer value as an encoded variable-length integer. Typically, the J rightmost bytes may be written to a byte-stream, and in one embodiment, routine 300 may return or otherwise indicate the number of bytes (J) that it wrote to the byte-stream. In the illustrated example, routine 300 may store an encoded variable-length integer value of 0x00021C1E. Routine 300 ends at block 399.

Figure 6:
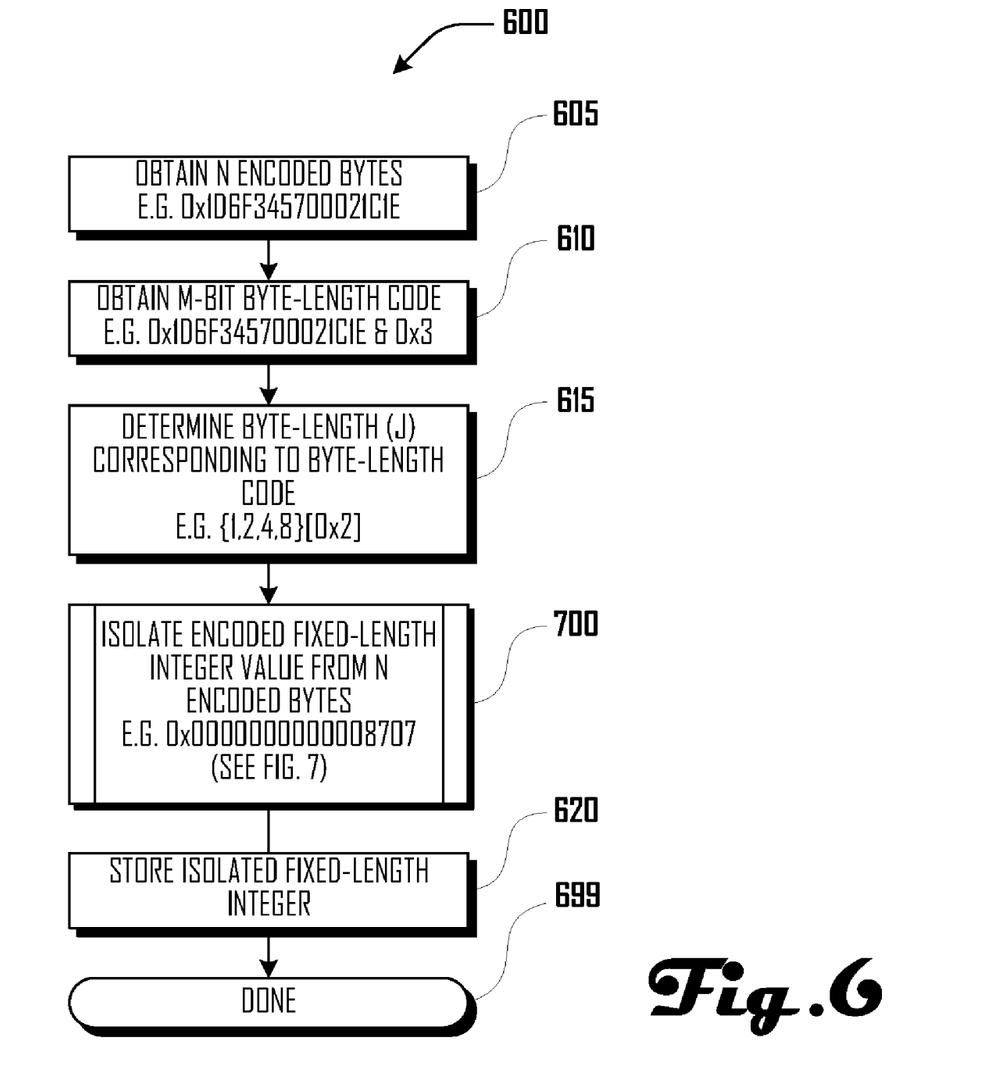
FIG. 6 is a flow diagram of an exemplary variable length integer decoding routine in accordance with one embodiment.

FIG. 6 illustrates an exemplary variable length integer decoding routine 600 in accordance with one embodiment. In block 605, routine 600 obtains N encoded bytes, for example, from a byte-stream of encoded integers such as those obtained from routine 300. As used herein, "N" refers to the maximum byte-length (J) of an encoded integer. In the illustrated example, N corresponds to a maximum byte-length J of eight, and routine 700 obtains eight bytes comprising at least one encoded variable-length integer. In the illustrated example, routine 600 obtains eight bytes having a value of 0x1D6F345700021C1E.

In block 610, routine 600 obtains, from the N encoded bytes, an M-bit byte-length code. In one embodiment, the M-bit byte-length code may be obtained via a bitmask operation (e.g. a bitwise AND or other bitwise logical conjunction) using a predetermined, constant control bitmask. In the illustrated example, M is two and the M-bit byte-length code may be obtained by isolating the M control bits with the bitmask 0x3 (bit pattern "11"), resulting in the byte-length code of 0x2.

In block 615, routine 600 determines a byte-length (J) corresponding to the obtained M-bit byte-length code. In one embodiment, the byte-length (J) may be obtained by using the M-bit byte-length code to obtain a corresponding byte-length from a predetermined ordered group of byte-lengths. In the illustrated example, the M-bit byte-length code (2) is used to index an array of byte-lengths {1, 2, 4, 8} to obtain a byte-length J of 4 bytes.

In block 700, routine 600 calls subroutine 700 (see FIG. 7, discussed below) to isolate the J-byte encoded fixed-integer value from the N encoded bytes.

Figure 7:
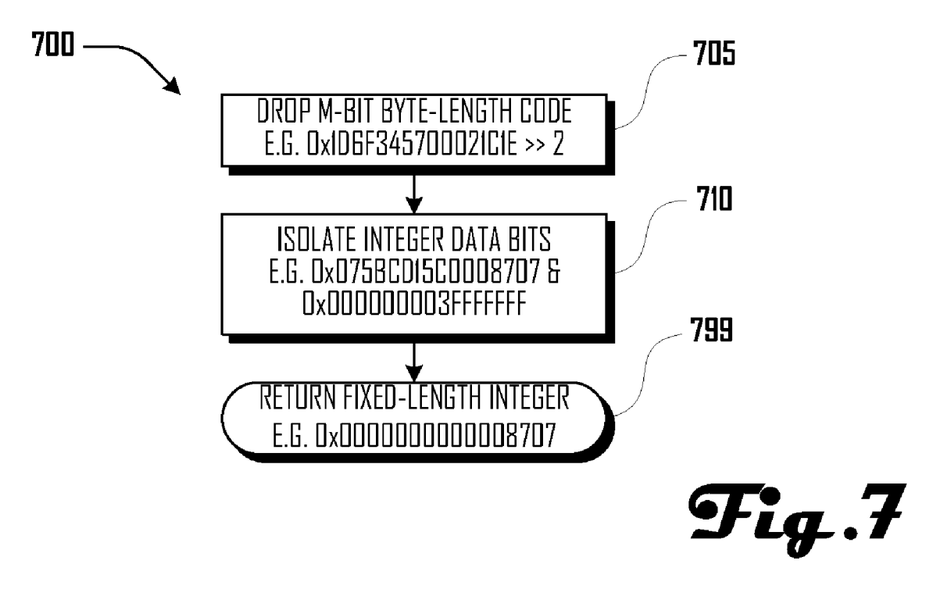
FIG. 7 is a flow diagram of an exemplary fixed-integer isolation subroutine in accordance with one embodiment.

FIG. 7 illustrates an exemplary fixed-integer isolation subroutine 700 in accordance with one embodiment. In block 705, subroutine 700 drops the M-bit byte-length code from the N encoded bytes. In one embodiment, subroutine 700 drops the M-bit byte-length code by shifting the N encoded bytes to the right by M bits. In various embodiments, this operation may be accomplished by rotating or circular-shifting the operand to the right, as well as by logically or arithmetically right-shifting the N encoded bytes. In other embodiments, this operation may also be accomplished by dividing the N encoded bytes by $2^M$, or by other suitable operations. In the illustrated example, dropping the M-bit byte-length code from the N encoded bytes results in N bytes having a value of 0x075BCD15C0008707.

In block 710, subroutine 700 isolates from the N encoded bytes the ((J*8)−2) data bits comprising the encoded fixed-length integer. In one embodiment, isolating these data bits comprises applying a bitmask corresponding to the encoded integer's byte-length J. In the illustrated example, the M-bit byte-length code (2) is used to index an array of bitmasks, {0x00000000000003full, 0x0000000000003fffull, 0x000000003fffffffull, 0x3fffffffffffffffull}, to obtain a data bitmask of 0x000000003fffffffull, which when applied to the N encoded bytes, isolates the encoded fixed-length integer value of 0x0000000000008707. In other embodiments, the appropriate data bits may be isolated by other suitable means. At block 799, subroutine 700 returns the isolated fixed length integer.

Referring again to FIG. 6, in block 620, routine 600 stores the isolated fixed-length integer at least temporarily. Routine 600 ends at block 699. In some embodiments, routine 600 may also return or otherwise indicate the number of bytes (J) corresponding to the encoded variable-length integer.

Although specific embodiments have been illustrated and described herein, it will be appreciated by those of ordinary skill in the art that a whole variety of alternate and/or equivalent implementations may be substituted for the specific embodiments shown and described without departing from the scope of the present disclosure. This application is intended to cover any adaptations or variations of the embodiments discussed herein.

The invention claimed is:

1. A method executing on a computing system for encoding a byte-stable variable-length integer, the method comprising:
    obtaining an N-byte fixed-length integer, N being an integer inclusively between 4 and 128, said fixed-length integer comprising i) at least M leading-zero bits, M being a predetermined integer constant inclusively between two and six, and ii) a contiguous pattern of significant bits of length P;
    selecting an M-bit byte-length code from a group of $2^M$ predetermined byte-length codes, each byte-length code corresponding to a predetermined variable-byte-length constant inclusively between one and N, said selected M-bit byte-length code corresponding to a variable-byte-length constant (J);
    encoding a J-byte variable-length integer comprising a rightmost M bits corresponding to said M-bit byte-length code, and left-adjacent to said rightmost M bits, P contiguous bits corresponding to said contiguous pattern of significant bits; and
    storing said encoded J-byte variable-length integer to a storage device associated with the computing system.

2. The method of claim 1, wherein said N-byte fixed-length integer is a 64-bit integer, and M is two.

3. The method of claim 1, wherein members of said group of $2^M$ predetermined byte-length codes respectively correspond to members of a group of predetermined variable-byte-length constants comprising at least 1, 2, 4, and 8.

4. The method of claim 1, wherein selecting an M-bit byte-length code from a group of $2^M$ predetermined byte-length codes:
    determining a number corresponding to a selected one of a number of leading-zero bits of said N-byte fixed-length integer and a number of significant bits of said N-byte fixed-length integer; and
    selecting an M-bit byte-length code according to said determined number.

5. The method of claim 1, wherein encoding said J-byte variable-length integer comprises:
    left-shifting said N-byte fixed-length integer by M bits; and
    adding an integer corresponding to said M-bit byte-length code to said left-shifted N-byte fixed-length integer.

6. The method of claim 1, wherein storing said encoded J-byte variable-length integer comprises inserting said J-byte variable-length integer into an encoded byte-stream comprising a plurality of variable-length integers.

7. A computer-readable storage medium having stored thereon instructions that, when executed by a processor, perform the method of claim 1.

8. A computing apparatus comprising a processor and a memory, the memory having stored therein instructions that, when executed by the processor, perform the method of claim 1.

9. A method executing on a computing system for decoding an encoded byte-stream, the method comprising:
    obtaining from a calling process a sequence of N bytes from the encoded byte-stream, the encoded byte-stream comprising a plurality of variable-length integers, each variable-length integer corresponding to a contiguous significant-bit-sequence of inclusively between one and (N*8) bits in length, N being an integer inclusively between 4 and 128;
    obtaining a control pattern consisting of M rightmost bits from said sequence of N bytes, M being a predetermined integer constant inclusively between two and six;

determining a byte-length (J) corresponding to said pattern of M rightmost bits, J being an integer inclusively between one and N;

isolating K contiguous integer-data bits left-adjacent to said M rightmost bits, K being an integer corresponding to (8−M)+(8*(J−1));

determining a current integer value corresponding to said K contiguous integer-data bits; and storing a fixed-length integer corresponding to said determined current integer value to a storage device associated with the computing system.

10. The method of claim 9, further comprising indicating said determined byte-length (J) to said calling process.

11. The method of claim 9, wherein obtaining a control pattern consisting of M rightmost bits from said sequence of N bytes comprises applying to said sequence of N bytes a predetermined control bitmask corresponding to said M rightmost bits.

12. The method of claim 11, wherein M is equal to 2 and said predetermined control bitmask corresponds to 0x3.

13. The method of claim 9, wherein determining a byte-length (J) corresponding to said pattern of M rightmost bits comprises obtaining one of an ordered set of predetermined data bitmasks.

14. The method of claim 11, wherein said ordered set of predetermined data bitmasks comprises 0x3f, 0x3fff, 3ffffff, and 0x3ffffffffffffff.

15. The method of claim 9, wherein isolating K contiguous integer-data bits left-adjacent to said M rightmost bits comprises right-shifting said N-byte fixed-length integer by M bits.

16. The method of claim 15, wherein determining a current integer value corresponding to said K contiguous integer-data bits comprises applying one of an ordered set of predetermined data bitmasks to said right-shifted N-byte fixed-length integer.

17. A computer-readable storage medium having stored thereon instructions that, when executed by a processor, perform the method of claim 9.

18. A computing apparatus comprising a processor and a memory, the memory having stored therein instructions that, when executed by the processor, perform the method of claim 9.

19. A method executing on a computing system for encoding a byte-stable variable-length integer, the method comprising:

obtaining an N-byte fixed-length integer, N being an integer greater than three, said fixed-length integer comprising i) at least M leading-zero bits, M being a predetermined integer constant inclusively between two and six, and ii) a contiguous pattern of significant bits of length P;

selecting an M-bit byte-length code from a group of $2^M$ predetermined byte-length codes, each byte-length code corresponding to a predetermined variable-byte-length constant inclusively between one and N, said selected M-bit byte-length code corresponding to a variable-byte-length constant (J);

encoding a J-byte variable-length integer comprising a rightmost M bits corresponding to said M-bit byte-length code, and left-adjacent to said rightmost M bits, P contiguous bits corresponding to said contiguous pattern of significant bits; and storing said encoded J-byte variable-length integer to a storage device associated with the computing system.

* * * * *